(12) United States Patent
Huikai et al.

(10) Patent No.: US 8,908,728 B1
(45) Date of Patent: Dec. 9, 2014

(54) TRANSISTOR OUTLINE PACKAGE

(71) Applicant: Schott AG, Mainz (DE)

(72) Inventors: George Lin Huikai, Singapore (SG);
Amy Soon Li Ping, Singapore (SG);
Tetsushi Morikawa, Singapore (SG);
Rohit Bhosale, Munich (DE);
Shaifullah Bin Mohamed Kamari,
Singapore (SG)

(73) Assignee: Schott AG, Mainz (DE)

( * ) Notice: Subject to any disclaimer, the term of this patent is extended or adjusted under 35 U.S.C. 154(b) by 0 days.

(21) Appl. No.: 13/936,655

(22) Filed: Jul. 8, 2013

(51) Int. Cl.
*H01S 3/04* (2006.01)
*H01L 31/024* (2014.01)
*H01S 5/024* (2006.01)

(52) U.S. Cl.
CPC .......... *H01S 5/02415* (2013.01); *H01L 31/024* (2013.01)

USPC .............................. 372/36; 372/34; 372/43.01

(58) Field of Classification Search
USPC .......................................... 372/36, 34, 43.01
See application file for complete search history.

(56) References Cited

U.S. PATENT DOCUMENTS

| 2004/0247004 A1* | 12/2004 | Keh et al. .......................... 372/36 |
| 2006/0024006 A1* | 2/2006 | Kobayashi et al. .............. 385/94 |
| 2012/0051382 A1* | 3/2012 | Miao ............................. 372/50.1 |

FOREIGN PATENT DOCUMENTS

KR         100824922 B1     4/2008

* cited by examiner

*Primary Examiner* — Kinam Park
(74) *Attorney, Agent, or Firm* — Ohlandt, Greeley, Ruggiero & Perle, LLP

(57) ABSTRACT

A transistor outline package with integrated thermoelectric cooler is disclosed. The thermoelectric cooler is arranged on a heatsink which extends vertically into the housing of the transistor outline package.

20 Claims, 7 Drawing Sheets

TRANSISTOR OUTLINE PACKAGE

BACKGROUND OF THE INVENTION

1. Field of the Invention

The invention relates to a transistor outline (TO) package which comprises a mounting space for an electronic component, in particular a hermetically-sealed housing for a laser diode.

2. Description of Related Art

Transistor outline packages, which are used for transceivers in a high-speed computer and telecommunication networks, are known.

In particular, the 10 Gigabit Small Form Factor Pluggable (XPF) is the dominating standard for high-speed networks. Such transceivers comprise a housing with electrical feedthroughs. Inside the housing there is an electronic component comprising a laser diode or photodiode which is coupled with the optical network.

A standard XPF transceiver does not have any integrated cooling capacity. Therefore, XPF transceivers require an external heatsink to ensure sufficient heat dissipation during normal operation.

In addition, the material and process to manufacture XFP headers are costly and complicated.

The document KR 1824922 B shows a transistor outline package which comprises an integrated thermoelectric cooler. The cooler is arranged on the inner surface of the base of the transistor outline package. Since the chip with a laser diode is arranged parallel to the inner surface of the base, a mirror is necessary to reflect the light to the window. In addition, the RF pins have to run along adjacent to the thermoelectric cooler which might result in losses.

The document US 2012/0051382 shows a thermoelectric cooler which is arranged on the base of the header resulting in similar disadvantages as described above.

Accordingly, it is an object of the invention to provide a compact, efficient transistor outline package which comprises an integrated thermoelectric cooler.

SUMMARY OF THE INVENTION

The invention relates to a transistor outline package which comprises a metal base with an upper surface and a bottom surface.

Preferably, the metal base is circular and is hermetically sealed with a cap.

The cap comprises a window on its upper surface in order to couple light into the housing of the transistor outline package.

In particular, the cap can be embodied as a lens.

The transistor outline package comprises first electrical feedthroughs for transmitting radio frequency signals. These feedthroughs extend from the bottom surface to the upper surface.

Preferably, the feedthroughs are embodied as holes in which contact pins are embedded in glass.

The space above the base defines a mounting space for mounting an electronic component which is arranged above the upper surface of the base.

According to the invention, a heatsink extends from the upper surface of the base in a vertical direction with respect to the base into the mounting space.

Preferably, the heatsink comprises a metal and is in thermal connection with the metal base. The heatsink might consist of aluminium, or, for better heat dissipation, of copper.

The heatsink provides a vertical inner surface for mounting a thermoelectric cooling (TEC) and a chip comprising a laser diode.

Since the thermoelectric cooler and the chip with the laser diode are also arranged in a vertical manner with respect to the upper surface of the base, the photodiode is arranged line of sight to the window of the cap.

This results in a compact and simple arrangement.

The base also comprises second electrical feedthroughs for supplying the thermoelectric cooler which can be attached to the heatsink.

Preferably, also these second electrical feedthroughs are embodied as pins which are embedded in glass.

In a preferred embodiment, the TO package also comprises third electrical feedthroughs for supplying an electrical component inside the housing with current. These feedthroughs are also referred to as DC-pins.

According to an embodiment of the invention, the second electrical feedthroughs, also referred to as RF-feedthroughs, are in direct contact to an electric component, in particular to a chip with a laser diode.

With such an arrangement, bond wires to the RF-pins can be avoided in order to reduce losses.

Preferably, the first electrical feedthroughs for transmitting RF-signals to the chip and are embodied as a co-axial cable in the region of the electrical feedthrough.

According to an embodiment of the invention, the DC-pins are embodied as flat conductors. Such flat conductors can be provided by using a leadframe. Such thin wires are easy to mount.

Since the DC-pins are not used for transmitting radio frequency signals, it is possible to place several DC-pins in one single glass bead.

It is possible to place three or even five DC-pins in one compact base.

In another embodiment of the invention, the DC-pins comprise a nailhead pin to facilitate the attaching of bond wires.

According to another embodiment of the invention, the DC-pins comprise a flattened head. Since an electronic component is placed vertically with respect to the base, the flattened head can be aligned in a parallel manner with respect to an upper surface of the electronic component, also in order to facilitate the bonding of the DC-pins to the electronic component.

Preferably, the heatsink is spaced apart from an edge of said base to ensure that the heatsink is also spaced apart from a cap which is attached to the base.

In addition, the heatsink should not be arranged at the center of the base.

Preferably, the heatsink is spaced apart, but arranged near the edge of the base. When the thermoelectric cooler is attached on the heatsink and the chip with the laser diode on the thermoelectric cooler, the laser diode is arranged essentially at the center of the base so that the laser diode is arranged line of sight to a window of the cap.

The heatsink can be embodied as a plate, preferably the heatsink has a height to width ratio of at least three.

The heatsink has one flat surface for the mounting of the thermoelectric cooler.

The surface opposite to this flat surface might be curved in order to be adapted to the circular shape of the base.

DETAILED DESCRIPTION

Figure 1:
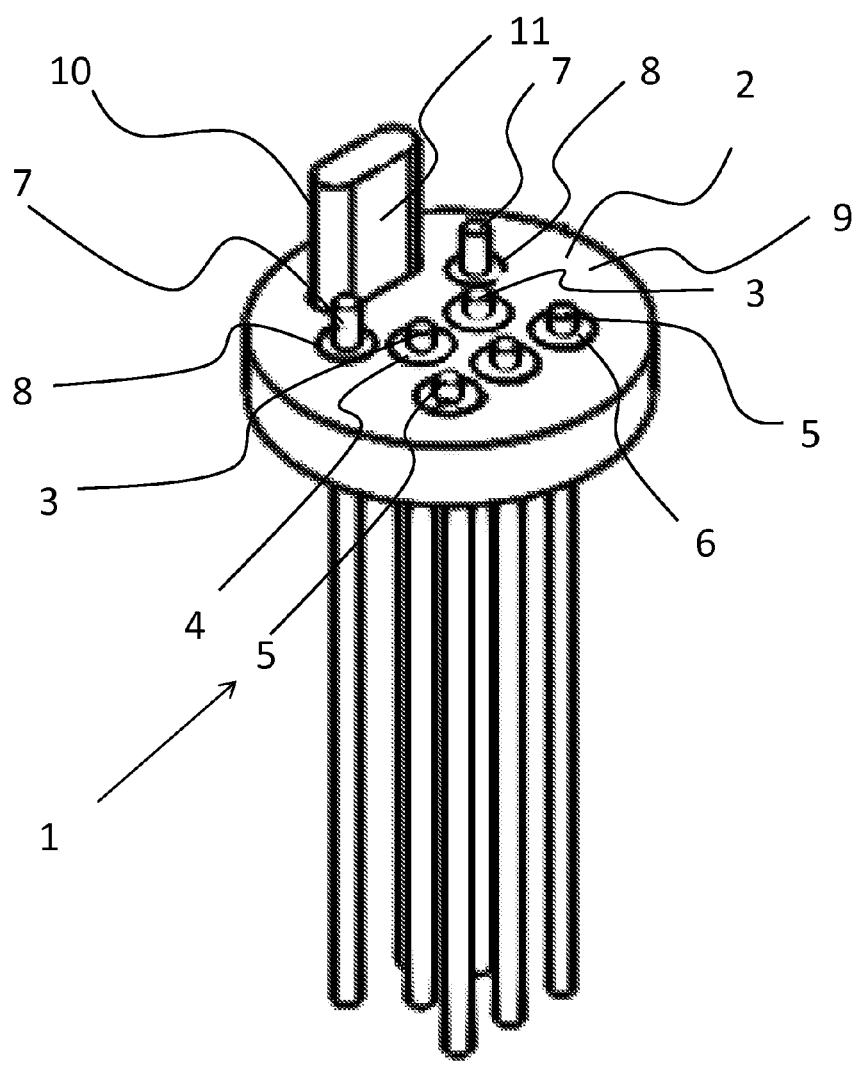
FIG. 1 is a perspective view of a transistor outline package without cap and which is also not fitted with a thermoelectric cooler and a laser diode.

FIG. 1 is a perspective view of a first embodiment of a transistor outline package 1 without cap and which is not fitted with the electronic components.

The transistor outline package 1 comprises a metal base 2 which has a circular shape.

A cap (not shown) will be attached to seal the transistor outline package 1 hermetically.

The base defines an upper surface to above the space for mounting the electronic components (not shown) is arranged.

Sensitive components of said TO-package 1 are the RF-pins 3 for transmitting the electronic data signals to the electric component.

The RF-pins 3 are embedded in glass 4 so that first electrical feedthroughs are provided for transmitting the radio frequency signals.

The RF-pins 3 are arranged essentially in the middle of the base.

Furthermore, this embodiment comprises three DC-pins 5 for supplying electronic components inside the TO-package with current.

The DC-pins 5 are also embedded in glass in order to provide a hermetically-sealed electrical feedthrough.

In addition, a heatsink 10 extends vertically into the mounting space of the TO-package.

The heatsink is arranged spaced apart but near the edge of the base 2.

The heatsink 10 comprises a flat surface 11 for mounting a thermoelectric cooler (TEC).

For supplying the thermoelectric cooler (not shown) with current, the TO-package comprises TEC-pins 7 which are also embedded in glass 8.

The TEC-pins 7 are arranged between the heatsink 10 and the RF-pins 8.

Since the TEC has, in general, a larger diameter as a chip with an integrated laser diode, the distance between the TEC-pins 7 is wider than the distance between the RF-pins.

Figure 2:
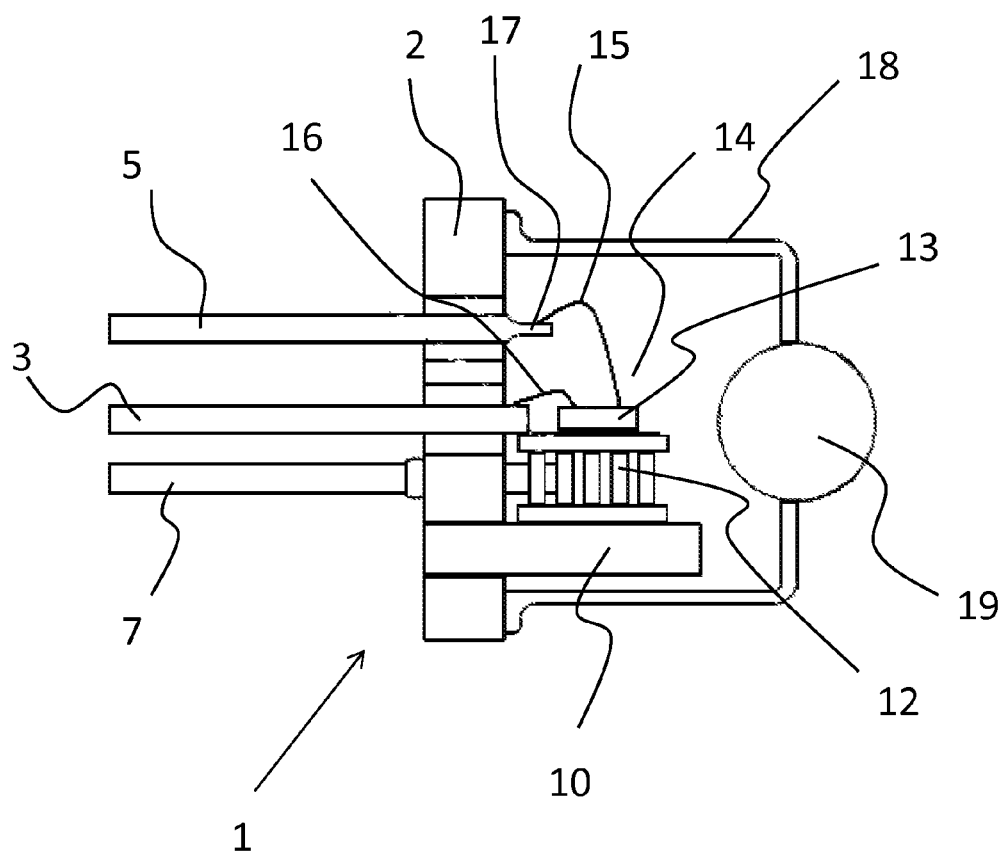
FIG. 2 is a schematic sectional view of an embodiment of the invention showing the transistor outline package with integrated thermoelectric cooler and laser diode.

FIG. 2 is a sectional view of an embodiment of a transistor outline package 1.

The TO-package comprises a metal base 2, which is hermetically sealed by a cap 18.

This defines a mounting space 14.

The heatsink 10 extends vertically with respect to the upper surface of the base into the mounting space 14.

A thermoelectric cooler 12 is attached to the heatsink 10. Such a thermoelectric cooler comprises a Peltier element and at least two electrical connections (not shown).

The hot side of the thermoelectric cooler 12 is attached to the heatsink.

The thermoelectric cooler 12 is supplied with current via the TEC-pins 7.

An electronic component 13 which comprises a chip with a laser diode (not shown) is attached onto the cold side of the thermoelectric cooler.

The electronic component 13 is supplied with current via the DC-pins 5.

In this embodiment the DC-pin 5 comprises a flattened head.

A bond wire 15 connects the DC-pin 5 with the electronic component 13.

Further bond wires 16 contact the electronic component with the RF-pin 3.

In order to reduce losses, the electronic component 13 is arranged directly adjacent to the RF-pin so that the length of the bond wire 16 is small.

The cap 18 comprises an upper surface with a window 19. The window 19 is embodied as a lens.

Since the electronic component 13 is arranged vertically with respect to the upper surface of the base in the mounting space 14, a laser diode on a chip (not shown) is arranged line of sight to the window 19.

Figure 3:
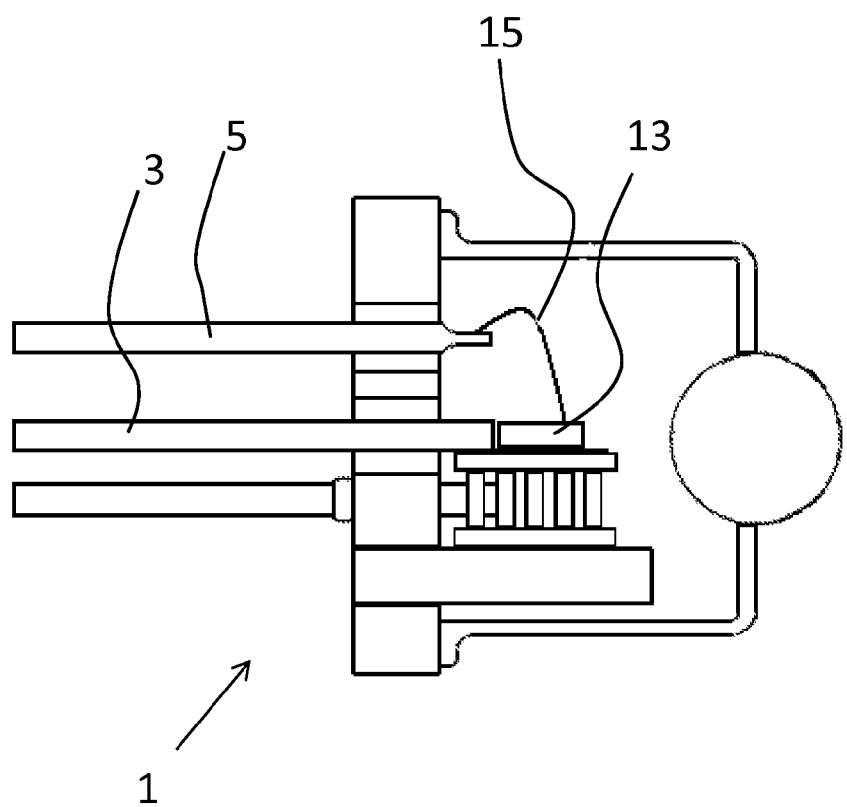
FIG. 3 is a sectional view of a further embodiment of the invention.

FIG. 3 is a sectional view of an alternative embodiment of a transistor outline package 1.

In contrast to FIG. 2, the RF-pin 3 has direct contact to the electronic component 13. Therefore, bond wires for the RF-pins are not necessary.

The DC-pins 5 are connected with the electronic component 13 with bond wires 15.

Figure 4:
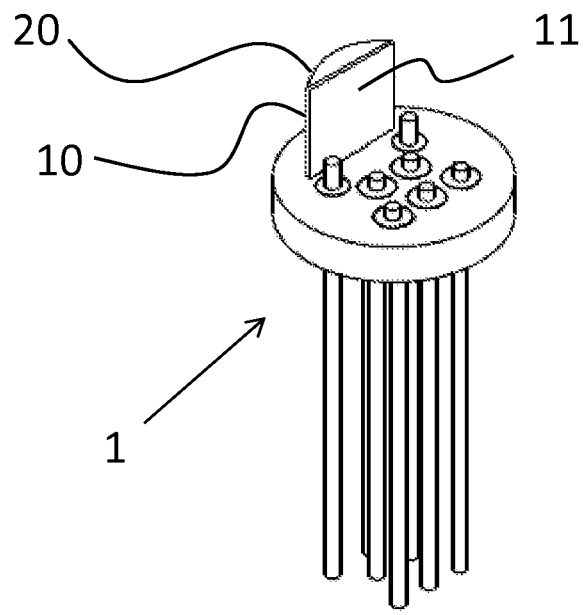
FIG. 4 is a perspective view of an alternative embodiment of the invention.

FIG. 4 is a perspective view of a further embodiment of a transistor outline package 1 which is not fitted with electronic components.

In contrast to FIG. 1, the heatsink 10 comprises a flat surface 11 for mounting a TEC and a curved surface 20 on its rear side in order to maximize the surface to volume ratio. Since the curved surface 20 follows the circular shape of the base, the heatsink 10 can be placed closer to the edge of the base and the usable area for the TEC is increased.

Figure 5:
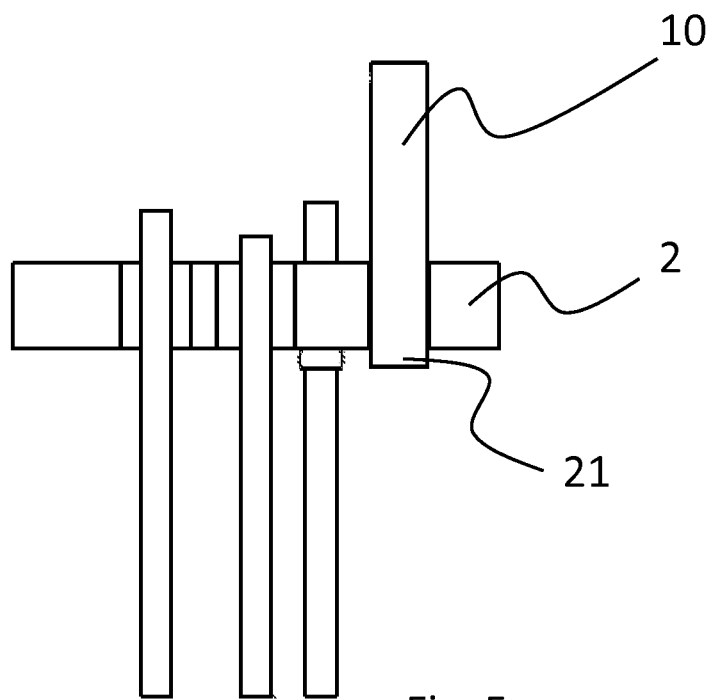
FIG. 5 is a sectional view showing an alternative embodiment of the heatsink.

FIG. 5 is a sectional view showing an alternative embodiment of heatsink 10.

The heatsink 10 comprises an extension 21 which extends below the bottom surface of the base 2 in order to improve the heat dissipation.

Figure 6:
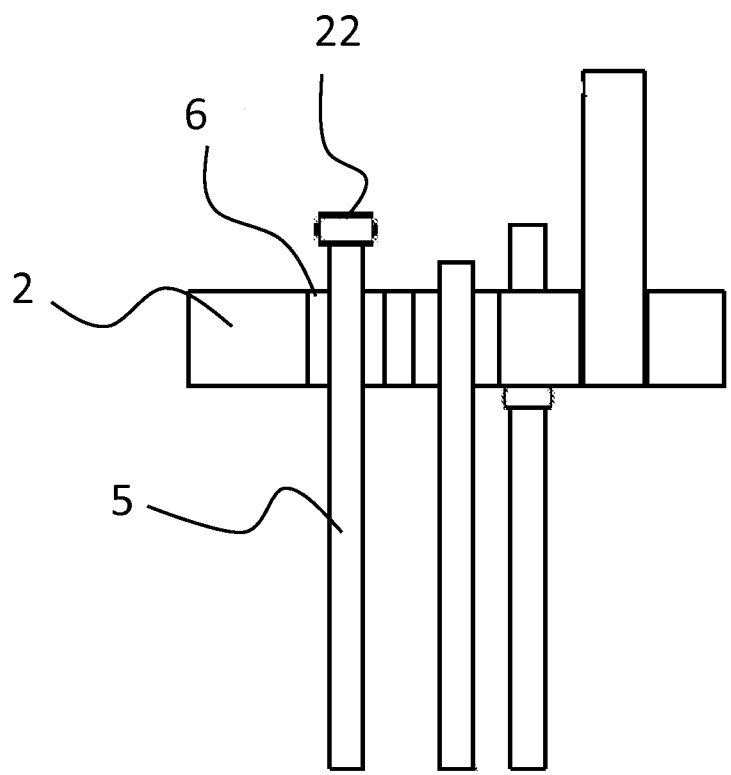
FIG. 6 is a sectional view showing an alternative embodiment of a DC-pin.

FIG. 6 is a sectional view showing an alternative embodiment of a DC-pin 5.

The DC-pin 5, which is embedded with glass 6 in an opening of the metal base, comprises a nailhead 22 in order to increase the wire-bonding surface.

Figure 7:
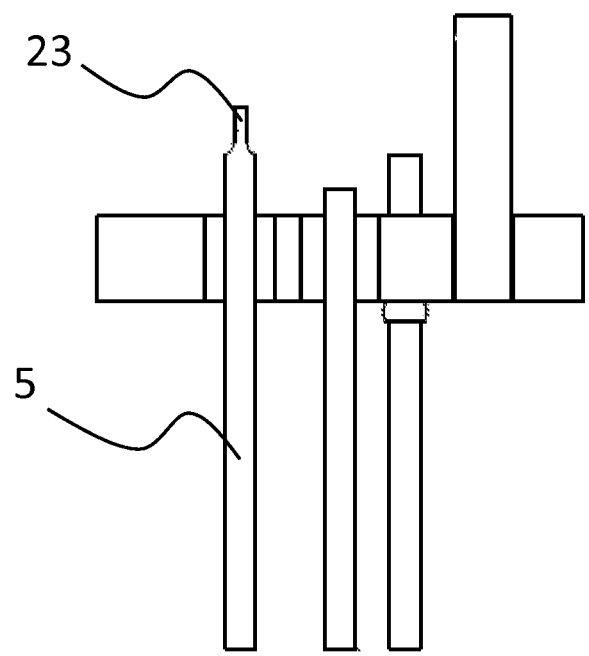
FIG. 7 is a further sectional view of an alternative DC-pin.

FIG. 7 is a sectional view showing a further embodiment of a DC-pin 5.

The DC-pin 5 comprises a flattened head 23.

Figure 8:
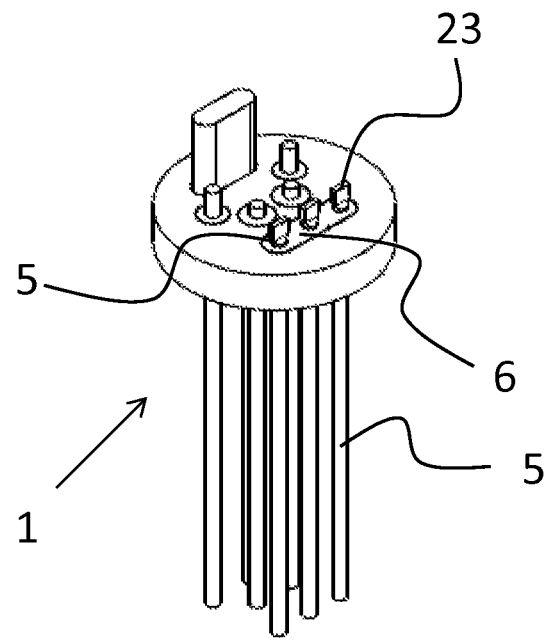
FIG. 8 to FIG. 10 are perspective views of further embodiments of transistor outline packages without cap, TEC and photodiode.

FIG. 8 is a perspective view of a TO-package 1, having DC-pins 5 with flattened head 23. The three DC-pins 5 are embedded in one bead of glass 6.

Figure 9:
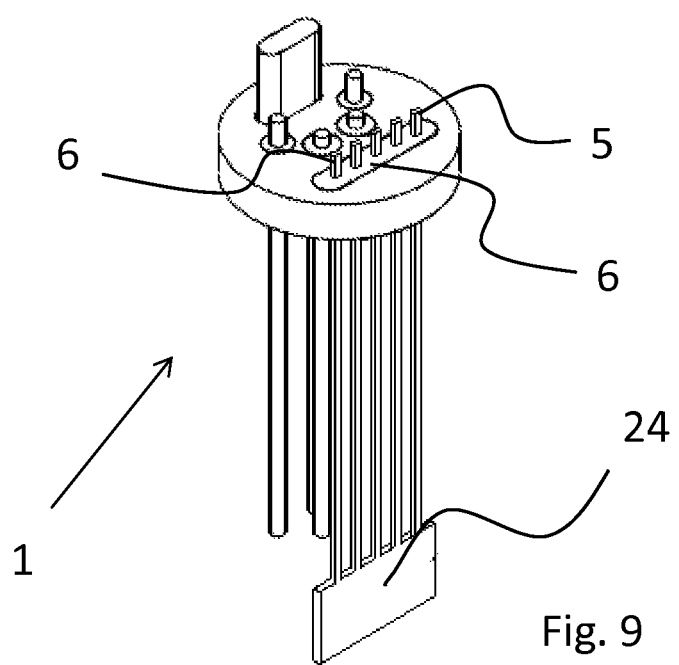

FIG. 9 is the perspective view of a further embodiment of a TO-package 1.

A leadframe 21 is used to provide DC-pins 5. Accordingly, the DC-pins 5 are embodied as flat conductors.

With this embodiment the number of DC-pins could be increased by reducing the pitch between the DC-pins 5.

The five DC-pins 5 are embedded in one bead of glass 6.

Figure 10:
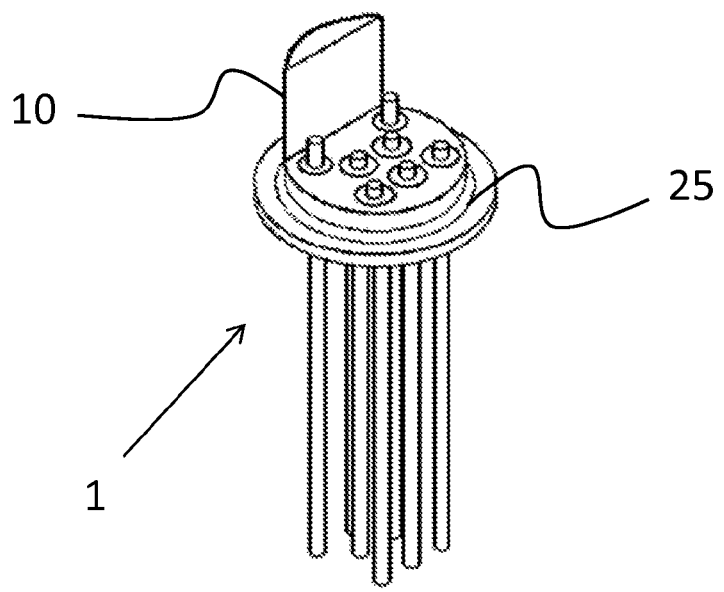

FIG. 10 is a further perspective view of an embodiment of a TO-package which essentially corresponds with the embodiment according to FIG. 4.

In particular, the TO-package 1 comprises a heatsink with a curved rear surface.

In contrast to FIG. 4, the base 2 comprises a collar 25 for mounting an alternative embodiment of a cap (not shown).

Various modifications may occur to those skilled in the art without departing from the inventive concept described herein.

Accordingly, the invention is not limited to the concrete embodiments as described with reference to the drawings.

What is claimed is:

1. A transistor outline package comprising:
   a metal base with an upper surface and a bottom surface;
   first electrical feedthroughs for transmitting radio frequency signals extending from said bottom surface to said upper surface;
   a mounting space for mounting an electronic component being arranged above said upper surface;
   a heatsink extending from said upper surface in a vertical direction into said mounting space; and
   second electrical feedthroughs for supplying a thermo electric cooler attachable to said heatsink.

2. The transistor outline package as claimed in claim 1, further comprising a thermo electric cooler in communication with the second electrical feedthroughs, wherein the second electrical feedthroughs comprise pins extending into said mounting space and being in direct contact to the electronic component.

3. The transistor outline package as claimed in claim 1, wherein said mounting space is sealed with a cap, wherein said cap has an upper surface which comprises a window.

4. The transistor outline package as claimed in claim 3, further comprising an electronic component in said mounting space, wherein said electronic component comprises a laser diode or a photo diode which is arranged line of sight to said window.

5. The transistor outline package as claimed in claim 3, wherein said window is embodied as a lens.

6. The transistor outline package as claimed in claim 4, wherein said laser diode or photodiode is arranged on a thermo electric cooler, said thermo electric cooler being in communication with the second electrical feedthroughs.

7. The transistor outline package as claimed in claim 1, wherein said heatsink further comprises an extension on said bottom surface.

8. The transistor outline package as claimed in claim 1, further comprising third electrical feedthroughs for supplying the electronic component with current.

9. The transistor outline package as claimed in claim 8, wherein said third said electrical feedthroughs are flat conductors.

10. The transistor outline package as claimed in claim 8, wherein said third electrical feedthroughs are placed in a single glass bead in the base.

11. The transistor outline package as claimed in claim 1, wherein said first and said second electrical feedthroughs are embedded in a glass.

12. The transistor outline package as claimed in claim 8, wherein at least one of said first, second and third electrical feedthroughs comprise a nailhead pin, extending into said mounting space.

13. The transistor outline package as claimed in claim 8, wherein at least one of said first, second and third electrical feedthroughs comprise a pin with a flattened end, extending into said mounting space.

14. The transistor outline package as claimed in claim 1, wherein said heatsink is arranged acentrically in said mounting space.

15. The transistor outline package as claimed in claim 1, wherein said heatsink comprises a flat surface for mounting the thermo electric cooler.

16. The transistor outline package as claimed in claim 15, wherein said heatsink comprises a curved surface opposite to said flat surface.

17. The transistor outline package as claimed in claim 1, wherein said heatsink is spaced apart from an edge of said base.

18. The transistor outline package as claimed in claim 1, wherein said base is circular.

19. The transistor outline package as claimed in claim 1, wherein said heatsink has a ratio of height to width of at least 3.

20. A transistor outline package comprising:
    a metal base with an upper surface and a bottom surface;
    first electrical feedthroughs for transmitting radio frequency signals extending from said bottom surface to said upper surface;
    a cap which hermetically seals a mounting space, wherein said cap comprises a window;
    a heatsink extending from said upper surface in a vertical direction into said mounting space;
    a thermo electric cooler which is arranged on said heatsink;
    second electrical feedthroughs for supplying said thermo electric cooler; and
    a laser diode which is arranged on said heatsink line of sight to said window.

* * * * *